United States Patent [19]
Gilliam et al.

[11] Patent Number: 5,825,697
[45] Date of Patent: Oct. 20, 1998

[54] CIRCUIT AND METHOD FOR ENABLING A FUNCTION IN A MULTIPLE MEMORY DEVICE MODULE

[75] Inventors: Gary R. Gilliam; Kevin G. Duesman; Leland R. Nevill, all of Boise, Id.

[73] Assignee: Micron Technology, Inc., Boise, Id.

[21] Appl. No.: 577,840

[22] Filed: Dec. 22, 1995

[51] Int. Cl.$^6$ ................................................. G11C 7/00
[52] U.S. Cl. ........................................ 365/200; 365/225.7
[58] Field of Search .................... 365/200, 225.7, 365/230.03, 171

[56] References Cited

U.S. PATENT DOCUMENTS

| | | | |
|---|---|---|---|
| 5,110,754 | 5/1992 | Lowrey et al. | 437/52 |
| 5,126,971 | 6/1992 | Lin et al. | 365/171 |
| 5,241,496 | 8/1993 | Lowrey et al. | 365/96 |
| 5,257,229 | 10/1993 | McClure et al. | 365/200 |
| 5,301,143 | 4/1994 | Ohri et al. | 365/225.7 |
| 5,355,340 | 10/1994 | Coker et al. | 365/200 |
| 5,406,520 | 4/1995 | Tay | 365/225.7 |
| 5,412,593 | 5/1995 | Magel et al. | 365/225.7 |
| 5,566,107 | 10/1996 | Gilliam | 365/225.7 |
| 5,576,999 | 11/1996 | Kim et al. | 365/225.7 |

*Primary Examiner*—David C. Nelms
*Assistant Examiner*—Trong Quang Phan
*Attorney, Agent, or Firm*—Seed and Berry LLP

[57] ABSTRACT

A memory device module in a package having externally accessible contacts includes multiple integrated memory circuits accessible to external circuitry exclusively through the contacts. An accessing circuit for each memory circuit accesses memory cells in the memory circuit for communication with the external circuitry. Each accessing circuit can be enabled to access redundant memory cells instead of inoperative memory cells by an enabling signal. An enabling circuit for each accessing circuit can output the enabling signal in response to receiving a unique set of input signals from external circuitry. Each unique set is selected with fuses in each enabling circuit, and includes row and column address strobe signals and a data signal. Upon receiving its unique set, one of the enabling circuits advantageously enables its associated accessing circuit to access redundant memory cells without the accessing circuits of the other memory circuits also being so enabled.

57 Claims, 5 Drawing Sheets

CIRCUIT AND METHOD FOR ENABLING A FUNCTION IN A MULTIPLE MEMORY DEVICE MODULE

FIELD OF THE INVENTION

This invention relates in general to integrated memory circuits, and in particular to circuits and methods for enabling function circuits such as redundant memory cells in integrated memory circuits.

BACKGROUND OF THE INVENTION

In conventional memories, multiple integrated memory circuits are sometimes packaged together in a module referred to as a multiple memory device module. For example, multiple integrated memory circuits implemented on one or more dies can be packaged together in a multiple memory device module such as a single in-line memory module (SIMM), a dual in-line memory module (DIMM) and a multi-chip memory module (MCM). Of course, other package types also work.

Each integrated memory circuit in a multiple memory device module typically has one or more optional function circuits which can be enabled if necessary. For example, a redundant memory cell in an integrated memory circuit can be enabled to replace an inoperable memory cell having an address which is typically determined during the manufacturing process. Another typical optional function circuit allows for fine tuning of the component values of circuit elements such as resistors and capacitors in an integrated memory circuit. These redundant memory elements or other optional function circuits are typically enabled by opening laser fuses or shorting anti-fuses. For this reason, the redundant elements or function circuits are generally enabled at the chip level before the chip has been placed in a module. If a defect is found in a memory chip once the chip has been placed in a module, either the memory chip must be removed from the module for enabling the redundant elements or function circuits or the redundant elements or function circuits must be enabled for all chips on the module. For these reasons, memory device repair and the selection of optional functions once memory chips have been assembled together in a module has not been feasible for individual memory chips.

One approach to enabling a function circuit in an integrated memory circuit packaged along with other integrated memory circuits in a multiple memory device module might be to apply a high voltage to one of the input terminals of the module. The high voltage would then generally be strobed into the module with an address strobe signal such as CAS, and would be applied to each integrated memory circuit in the module which shares the same address strobe signal. Within each integrated memory circuit receiving the high voltage, programmable elements, such as anti-fuses, would be blown by the high voltage to enable the desired function circuit.

Thus, for example, if the high voltage was applied to the inputs of a multiple memory device module receiving both a CAS1 signal and a CAS2 signal, and the high voltage was then strobed into the module with the CAS1 signal, then the high voltage would be applied to each integrated memory circuit in the module which shares the CAS1 signal. As a result, the desired function circuit would be enabled in each integrated memory circuit which shares the CAS1 signal. Of course, the CAS1 signal could only go to one integrated memory circuit, in which case only the desired function circuit in that integrated memory circuit would be enabled.

For the above reasons, it does not appear to be possible to enable a desired function circuit in only one integrated memory circuit in a multiple memory device module. In a typical multiple memory device module, each integrated memory circuit has its own memory array which includes memory cells arranged in rows and columns and associated redundant memory cells typically arranged in rows. If a memory cell in a row in one of the integrated memory circuits is inoperable, then the above-described approach to repairing the inoperable memory cell would be to replace the row it is in with an associated row of redundant memory cells. At the same time, however, this approach would also replace operable memory cells in the other integrated memory circuits in the multiple memory device module with their associated rows of redundant memory cells. Consequently, in a multiple memory device module having two integrated memory circuits which share the same CAS signal, a row in one of the integrated memory circuits would be replaced with an associated redundant row despite the fact that the replaced row is not faulty.

This inability to isolate a faulty row in a single integrated memory circuit in a multiple memory device module for replacement would reduce the rate of success for repairing multiple memory device modules, since each repair would cause many operable standard memory cells to be unnecessarily replaced. Thus, for example, in a multiple memory device module having eight integrated memory circuits, repairing one inoperable standard memory cell would result in the replacement of one row of standard memory cells in each of the eight integrated memory circuits with an associated redundant row. If there is a 99% chance associated with each redundant row that it does not contain an inoperable memory cell, then there is a $(0.99)^8$ or only a 92% chance that all eight redundant rows do not contain inoperable memory cells. During a typical manufacturing run of thousands of multiple memory device modules, the difference between a 99% rate of successful repair and a 92% rate is obviously of great significance.

Therefore, there is a need in the art for a circuit and method for advantageously enabling a function circuit, such as a redundant memory cell, in only one of the integrated memory circuits in a multiple memory device module. Such a circuit and method should, when used to repair multiple memory device modules with inoperable standard memory cells, provide an increased rate of successful repair.

SUMMARY OF THE INVENTION

An inventive memory device module has a plurality of integrated memory circuits each operatively coupled to a communication coupler in the package for communicating with circuitry external to the package. Each integrated memory circuit receives a plurality of input signals including at least one address strobe signal, addresses, and other input signals from external circuitry. The inputs may be received through externally accessible contacts, or from a contactless interface such as a radio frequency or optical signal interface. The module also includes an enabling circuit, preferably including a NAND gate, corresponding to each of the integrated memory circuits. Each enabling circuit is operatively coupled to its respective integrated memory circuit to receive at least some of the input signals. Each enabling circuit is uniquely responsive to a corresponding set of the input signals by outputting an enabling signal. Each set includes at least one of the other input signals. The module further includes a function circuit corresponding to each of the enabling circuits. Each function circuit is enabled by receiving an enabling signal from its respective enabling circuit. Preferably, the function circuits are redundant memory cells.

In this manner, the respective function circuit of one of the integrated memory circuits is advantageously enabled without the respective function circuits of the other integrated memory circuits being enabled.

DETAILED DESCRIPTION OF THE INVENTION

Figure 1:
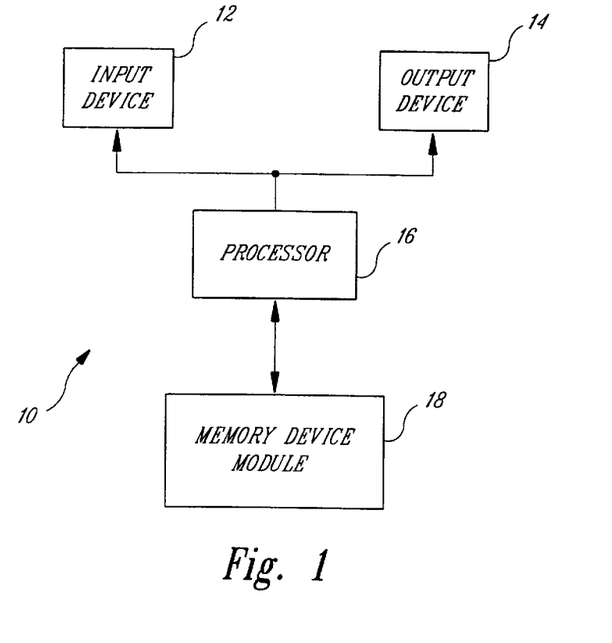
FIG. 1 is a block diagram of a preferred computer system according to the present invention including a memory device module.

In a preferred embodiment of the present invention shown in FIG. 1, a computer system 10 includes an input device 12, such as a keyboard, and an output device 14, such as a CRT monitor, both of which are operatively coupled to a conventional processor 16. The computer system 10 further includes a multiple memory device module 18 operatively coupled to the processor 16. It will be understood by those with skill in the field of this invention that the present invention is applicable to any multiple memory device module, including those that comprise dynamic random access memories (DRAMs) or static random access memories (SRAMs).

Figure 2:
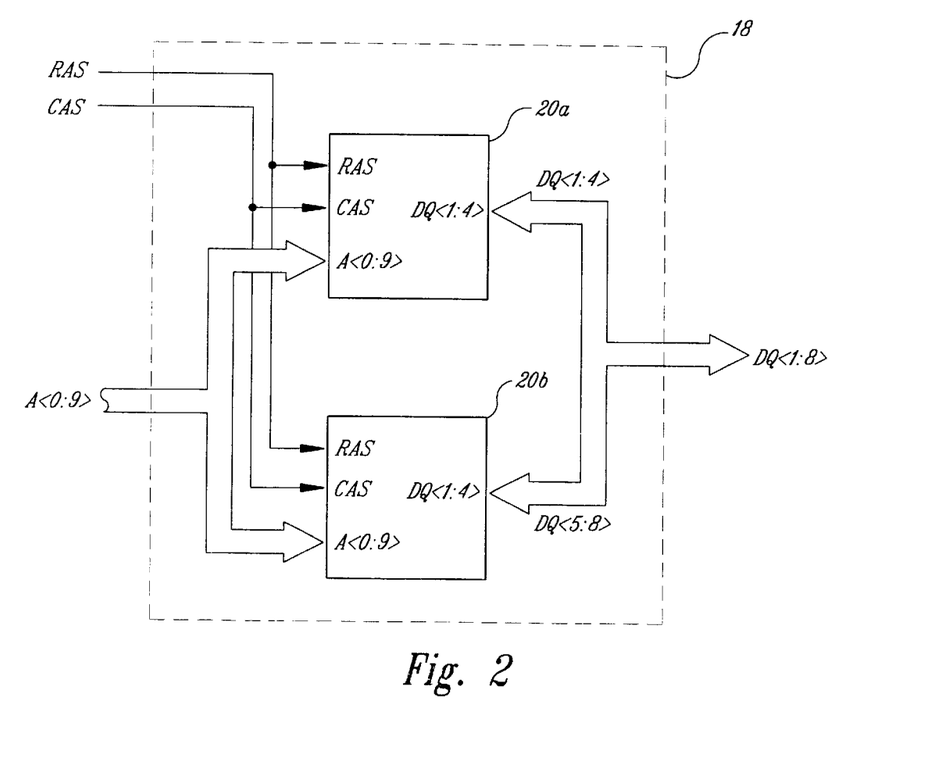
FIG. 2 is a block diagram of the memory device module of FIG. 1 including integrated memory circuits.

One embodiment of the memory device module 18 of FIG. 1 is shown in more detail in FIG. 2. It includes a plurality of integrated memory circuits 20a and 20b operatively coupled to the processor 16 (not shown) to receive address strobe signals RAS and CAS and addresses A<0:9> from the processor 16 (not shown), and to transfer data signals DQ<1:8> to and from the processor 16 (not shown).

Figure 3:
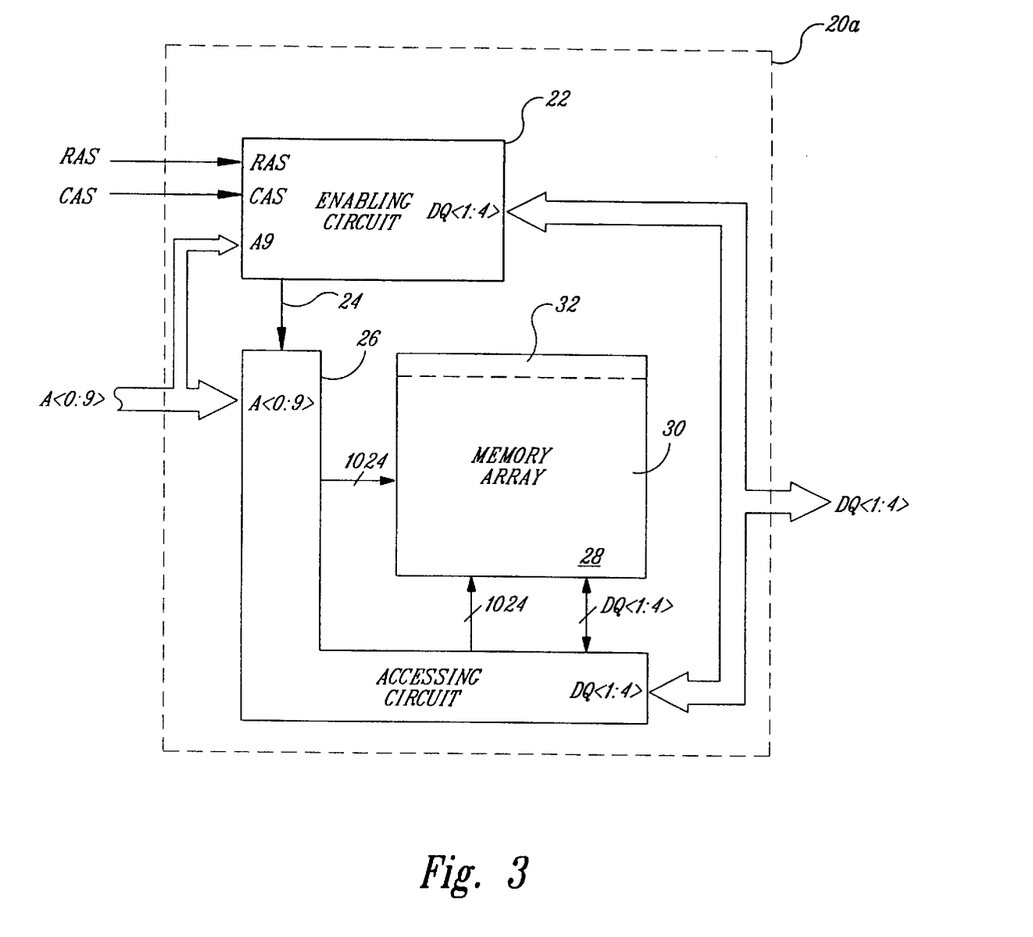
FIG. 3 is a block diagram of one of the integrated memory circuits of FIG. 2 including an enabling circuit.

One of the integrated memory circuits 20a of FIG. 2 is shown in more detail in FIG. 3. It includes an enabling circuit 22 which provides an enabling signal 24 in response to receiving a set of signals which is unique to the enabling circuit 22. Preferably, the enabling circuit 22 is uniquely responsive to receiving a set of signals including the address strobe signals RAS and CAS, the A9 bit of the address, and a data signal such as DQ1. Of course, the set of signals could also include any one of the data signals DQ<2:4> instead of DQ1, but it will be understood that the set of signals does not have to include RAS, CAS, or any one of the data signals DQ<1:4>. Likewise, an identical enabling circuit in the other integrated memory circuit 20b (not shown) is preferably uniquely responsive to receiving a set of signals which includes the address strobe signals RAS and CAS and a data signal such as DQ5 (not shown in FIG. 3) by also providing an enabling signal. Of course, the set of signals could include any one of the data signals DQ<6:8> (not shown in FIG. 3) instead of DQ5, but does not have to include RAS, CAS, or any of the data signals DQ<5:8> (not shown in FIG. 3). In this manner, either enabling circuit can be uniquely identified and caused to provide its enabling signal if desired. The enabling circuit 22 will be described in more detail below with respect to FIGS. 4, 5 and 6.

An accessing circuit 26 receives the enabling signal 24. The accessing circuit 26 includes row and column decoders, data buffers, and sense amplifiers, and is coupled to a memory array 28 by 1024 row enable lines, 1024 column enable lines, and a 4-bit data bus. The memory array 28 includes both memory cells 30 and redundant memory cells 32. The accessing circuit 26 can access memory cells 30 selected according to a received address A<0:9> for writing or reading data signals DQ<1:4> to or from the memory cells 30, respectively.

The accessing circuit 26 may be programmed upon receipt of the enabling signal 24 and a received address A<0:9> corresponding to a memory cell 30 known to be inoperable to access one of the redundant memory cells 32 instead of the inoperable memory cell 30 when it receives the address A<0:9> of the inoperable memory cell 30. The accessing circuit 26 may be programmed by blowing fuses or anti-fuses to disable accessing of the inoperable memory cell 30 and to enable accessing of the redundant memory cell 32. The anti-fuses may be blown with a high voltage, such as 12 volts, received on an address signal line, such as (A8.) Although the present invention is described with reference to enabling a redundant memory cell, it will be understood that the claims are not limited to redundant memory cells, but rather include within their scope any function circuit in an integrated memory circuit which it is desirable to enable.

Figure 4:
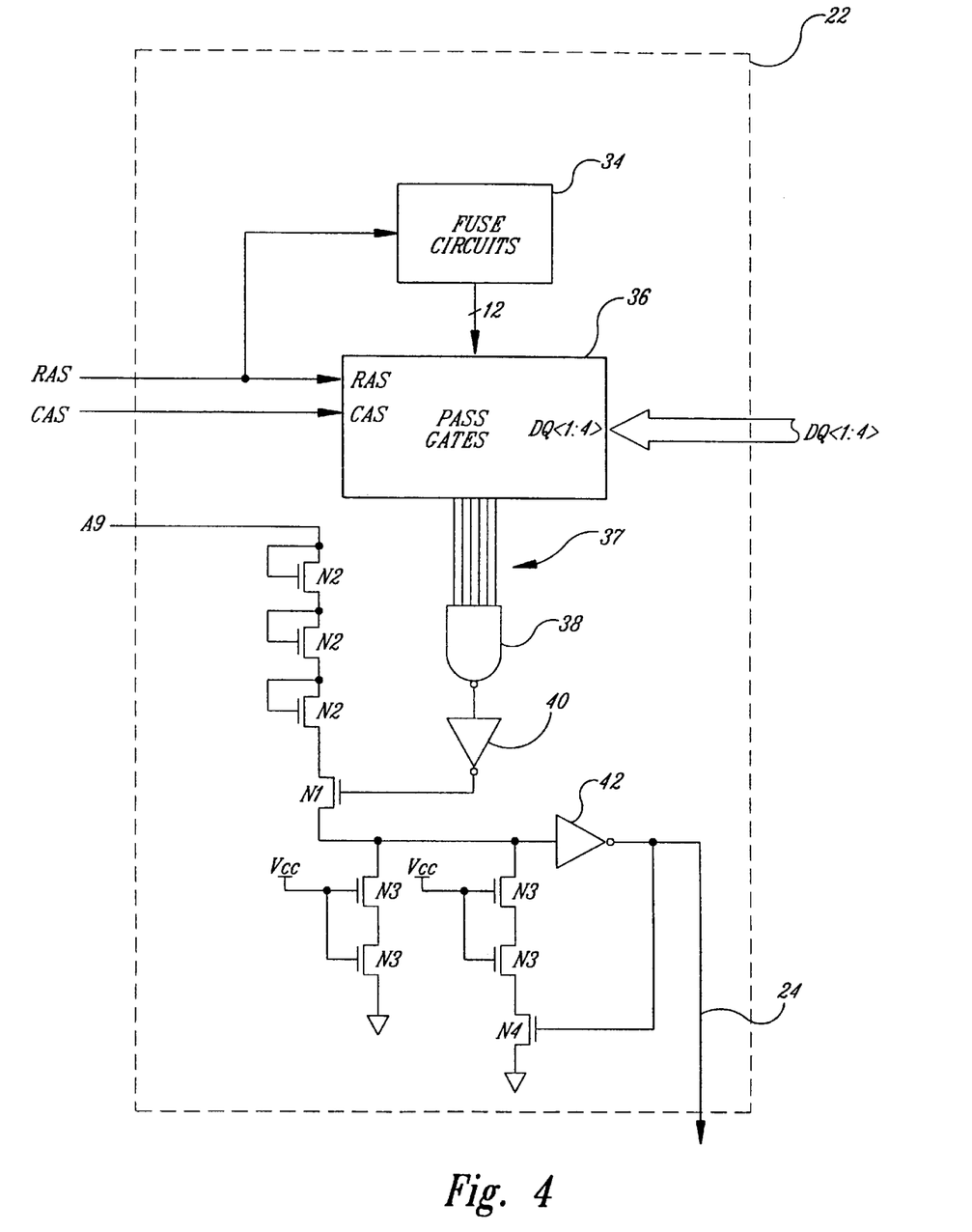
FIG. 4 is a block, schematic and logic diagram of the enabling circuit of FIG. 3 including fuse circuits and pass gates.

One embodiment of the enabling circuit 22 of FIG. 3 is shown in more detail in FIG. 4. It includes a plurality of fuse circuits 34 providing output signals to a plurality of pass gates 36 when it is interrogated by receiving a row address strobe RAS signal. Each of the fuse circuits 34 is associated with one of the input signals such as RAS, CAS and DQ<1:4>. Preferably, each of the fuse circuits 34 includes a metal or polysilicon fuse which can be blown by a laser during manufacturing to cause each of the fuse circuits 34 to provide an output signal to enable the input signal associated with a respective one of the fuse circuits 34 to be one of the signals in the set of signals to which the enabling circuit 22 is uniquely responsive. Of course, each fuse circuit 34 could alternatively include electrically programmable fuses or anti-fuses. The fuse circuits 34 will be described in more detail below with respect to FIG. 5.

Each of the pass gates 36 is also associated with one of the input signals such as RAS, CAS and DQ<1:4>, and each of the pass gates 36 receives the output signal of a respective one of the fuse circuits 34 associated with the same input signal. Each of the pass gates 36 is adapted to enable its associated input signal as one of the signals in the set of signals of the enabling circuit 22 upon receiving an output signal from a corresponding one of the fuse circuits 34. As a result, the input signals in the set of signals used to uniquely identify the integrated memory circuit 20a (not shown) can be selected during manufacturing by blowing the fuse circuits 34 associated with the desired input signals. The pass gates 36 will be described in more detail below with respect to FIG. 6.

The pass gates 36 provide inputs 37 to a NAND gate 38. Some of these inputs 37 are permanently enabled by the pass gates 36, and are thus high. The rest of the inputs 37 are the signals selected by the fuse circuits 34 to be in the set of signals to which the enabling circuit 22 is uniquely responsive. Thus, for example, if the fuse circuits 34 are blown so as to provide output signals to the pass gates 36 which cause the pass gates 36 to enable the input signals RAS, CAS and DQ1 as signals in the set of signals of the enabling circuit 22, then the NAND gate 38 receives RAS, CAS, DQ1 and three permanently high signals as its inputs 37.

In an alternate embodiment, a fixed set of input signals may be selected such as the RAS, CAS and DQ1 combination described above. In this case, the fuse circuits 34 and pass gates 36 are not required, and NAND gate 38 may be a three input NAND gate which receives the RAS, CAS and DQ1 signals. For memory modules where each memory integrated circuit receives a unique combination of RAS, CAS and DQ1, the enabling circuit of each memory integrated circuit may be uniquely addressed. A unique combination of RAS, CAS and DQ1 signals will result when each memory integrated circuit DQ pin is uniquely coupled to a module data pin. In the memory module of FIG. 2, for example, the DQ1 input of memory device 20a is coupled to data bus signal DQ1 and the DQ1 input of memory device 20b is coupled to data bus signal DQ5. A unique combination will also exist when there are multiple RAS or CAS signals and a unique RAS and CAS combination is used whenever the DQ1 input of two memory integrated circuits are coupled to a common module data pin.

In operation, when RAS, CAS and DQ1 all go high, then the output of the NAND gate 38 goes low. As a result, the output of an inverter 40 goes high and turns on an NMOS transistor N1. A high value on an address bit A9 turns on diode-connected NMOS transistors N2, and a high value is then applied as an input to an inverter 42. The output of the inverter 42 then goes low and the enabling signal 24 consequently goes low. At the same time, the low output of the inverter 42 turns off an NMOS transistor N4 and thus provides hysteresis by disabling one of the two pull down paths for the input of the inverter 42.

When either RAS, CAS or DQ1 goes low, the output of the NAND gate 38 goes high and the output of the inverter 40 goes low. As a result, the NMOS transistor N1 turns off and the NMOS transistors N3 pull the input of the inverter 42 low. The output of the inverter 42 and the enabling signal 24 then go high, causing the NMOS transistor N4 to turn on to provide hysteresis through the NMOS transistors N3 by helping to pull the input of the inverter 42 low.

Figure 5:
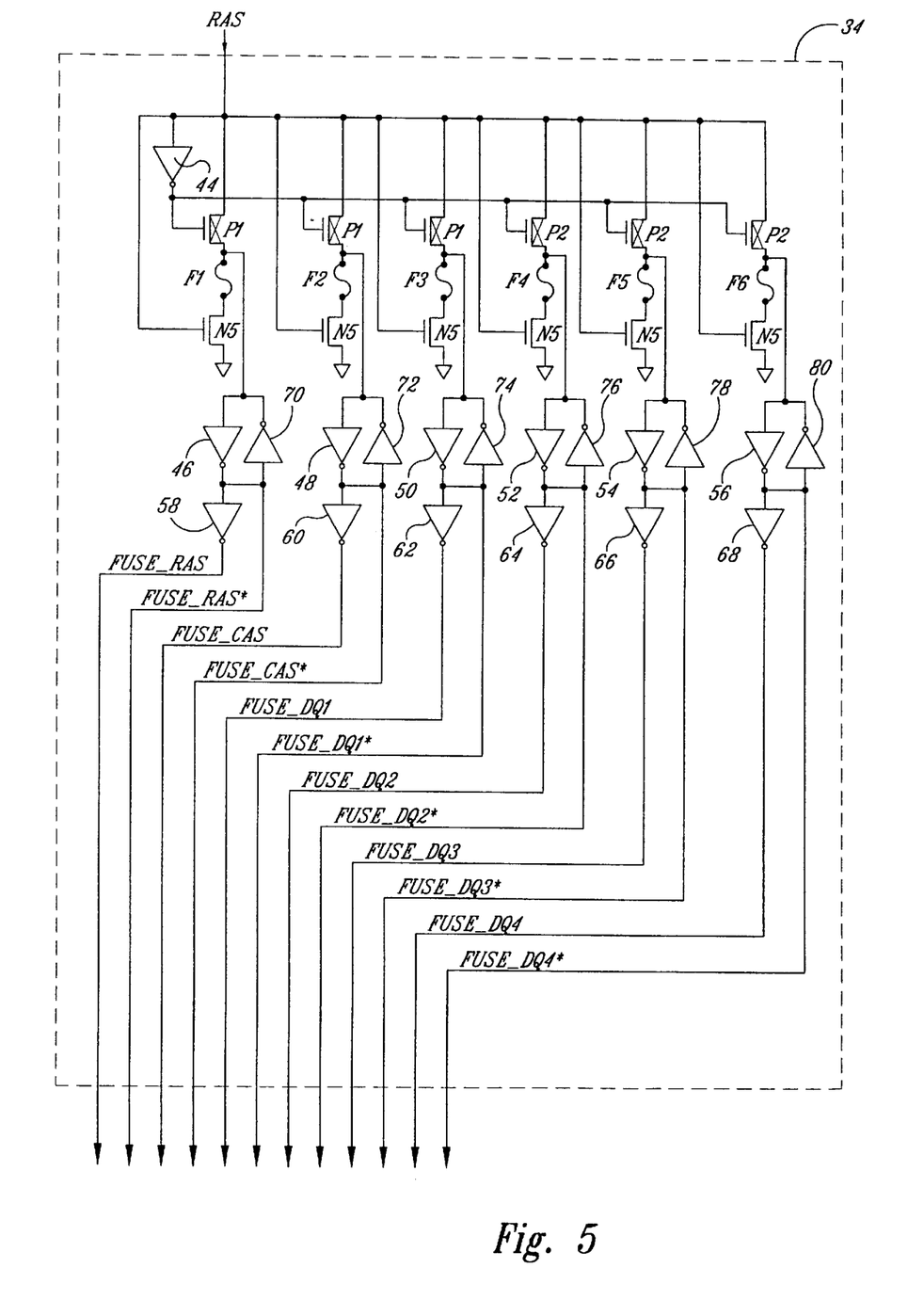
FIG. 5 is a schematic diagram of the fuse circuits of FIG. 4.

The fuse circuits 34 of FIG. 4 are shown in more detail in FIG. 5. In operation, a control signal, which may be RAS, is applied at the gates of NMOS transistors N5 to turn them on. At the same time, an inverter 44 receives the control signal at its input and provides a low voltage at its output to the gates of PMOS transistors P1 and P2, which turn on as a result. In this condition, the inputs to inverters 46, 48, 50, 52, 54 and 56 are low because of the relative W/L ratios of transistors N5, P1 and P2. As a result, the outputs of the inverters 46, 48, 50, 52, 54 and 56 go high, causing the outputs of inverters 58, 60, 62, 64, 66 and 68, and output signals FUSE_RAS, FUSE_CAS, FUSE_DQ1, FUSE_DQ2, FUSE_DQ3 and FUSE_DQ4, to go low. At the same time, the high output of the inverters 46, 48, 50, 52, 54 and 56 causes output signals FUSE_RAS*, FUSE_CAS*, FUSE_DQ1*, FUSE_DQ2*, FUSE_DQ3* and FUSE_DQ4* to go high, and causes the outputs of inverters 70, 72, 74, 76, 78 and 80 to go low to provide hysteresis by helping to pull the inputs to the inverters 46, 48, 50, 52, 54 and 56 low.

In order, for example, to enable input signals RAS, CAS and DQ1 as the set of signals to which the enabling circuit 22 (not shown) is uniquely responsive, fuses or antifuses F1, F2 and F3 are blown during manufacturing while fuses or antifuses F4, F5 and F6 are left intact. When the fuses F1, F2 and F3 are blown, and RAS is applied, the PMOS transistors P1 pull the inputs to the inverters 46, 48 and 50 high (since the fuses F1, F2 and F3 no longer provide a path to ground through the transistors N5), causing the outputs of these inverters to go low. As a result, the output signals FUSE_RAS*, FUSE_CAS* and FUSE_DQ1* also go low. The low outputs of the inverters 46, 48 and 50 applied to the inputs of the inverters 70, 72 and 74 causes their outputs to go high, thereby providing hysteresis by helping the PMOS transistors P1 pull their drains high. At the same time, the low outputs of inverters 46, 48 and 50 cause the outputs of inverters 58, 60 and 62, and the output signals FUSE_RAS, FUSE_CAS and FUSE_DQ1, to go high.

Figure 6:
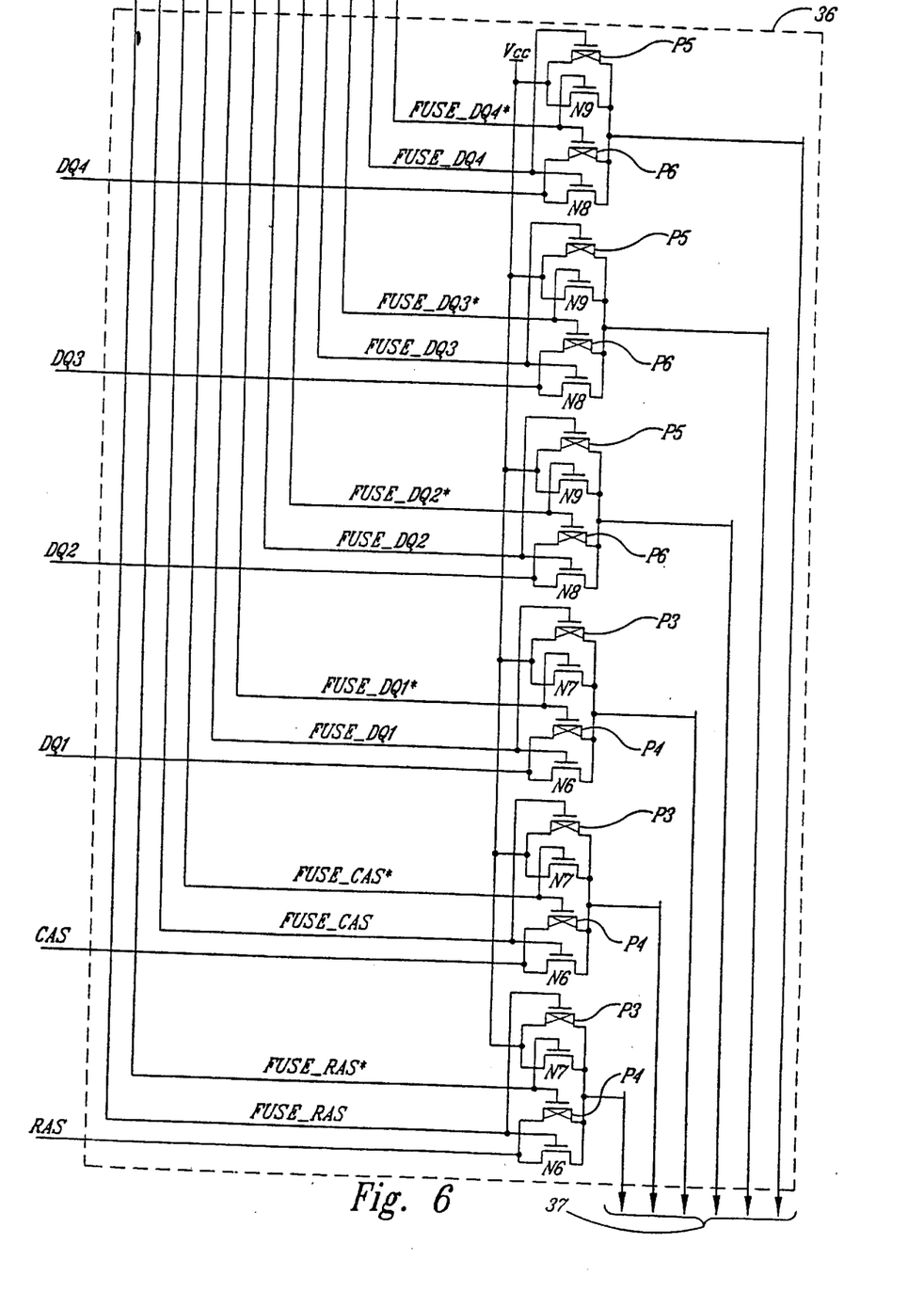
FIG. 6 is a schematic diagram of the pass gates of FIG. 4.

The pass gates 36 of FIG. 4 are shown in more detail in FIG. 6. The high FUSE_RAS, FUSE_CAS and FUSE_DQ1 output signals from the fuse circuits 34 (not shown) turn NMOS transistors N6 on and PMOS transistors P3 off. At the same time, the low FUSE_RAS*, FUSE_CAS* and FUSE_DQ1* output signals from the fuse circuits 34 (not shown) turn NMOS transistors N7 off and PMOS transistors P4 on. With the NMOS transistors N6 and the PMOS transistors P4 on, the RAS, CAS and DQ1 input signals are passed through the pass gates 36 as inputs to the NAND gate 38 (not shown) and as the signals uniquely identifying the integrated memory circuit 20a (not shown).

Conversely, the low FUSE_DQ2, FUSE_DQ3 and FUSE_DQ4 output signals from the fuse circuits 34 (not shown) turn NMOS transistors N8 off and PMOS transistors P5 on. At the same time, the high FUSE_RAS*, FUSE_CAS* and FUSE_DQ1 * output signals from the fuse circuits 34 (not shown) turn NMOS transistors N9 on and PMOS transistors P6 off. With the NMOS transistors N9 and the PMOS transistors P5 on, the supply voltage $V_{cc}$ is passed through the pass gates 36 as inputs to the NAND gate 38 (not shown). The input signals DQ2, DQ3 and DQ4 are not passed through the pass gates 36 as inputs to the NAND gate 38 (not shown) because NMOS transistors N8 and PMOS transistors P6 are off. In an alternative embodiment, NMOS transistors N7 and N9 may be omitted.

The present invention thus advantageously provides a circuit and method for enabling a function circuit such as a redundant memory cell in one of the integrated memory circuits in a multiple memory device module. Significantly, the respective function circuit of one of the integrated memory circuits can be enabled without the respective function circuits of the other integrated memory circuits being enabled. The circuit and method also advantageously provide an increased rate of successful repair when used to repair multiple memory device modules with inoperable standard memory cells.

Although the present invention has been described with reference to a preferred embodiment the invention is not limited to this preferred embodiment. Rather, the invention is limited only by the appended claims, which include within their scope all equivalent devices or methods which operate according to the principles of the invention as described.

We claim:

1. A memory device module comprising:
   a plurality of integrated memory circuits fabricated on respective semiconductor dies that are separate from each other each of the integrated memory circuits receiving a plurality of input signals including at least one address strobe signal, addresses, and other input signals from external circuitry;
   a plurality of enabling circuits each corresponding to one of the integrated memory circuits, each enabling circuit operatively coupled to its respective integrated memory circuit for receiving at least some of the input signals, each enabling circuit being uniquely responsive to a corresponding set of the input signals by outputting an enabling signal, each enabling circuit's corresponding set of the input signals including at least one of the other input signals; and a plurality of function circuits each operatively coupled to a corresponding one of the enabling circuits, each function circuit being enabled by receiving the enabling signal from its respective enabling circuit, whereby the respective function circuit of one of the integrated memory circuits can be enabled without the respective function circuits of the other integrated memory circuits being enabled.

2. The memory device module of claim 1 wherein each enabling circuit comprises a NAND gate.

3. The memory device module of claim 1 wherein each enabling circuit's corresponding set of the input signals includes a row address strobe signal, a column address strobe signal, and a data signal.

4. The memory device module of claim 1 wherein each function circuit comprises a redundant memory cell.

5. The memory device module of claim 1 wherein each integrated memory circuit includes a memory array having a plurality of primary memory cells and a plurality of redundant memory cells, wherein each function circuit comprises an accessing circuit operatively coupled to the function circuit's respective integrated memory circuit for receiving addresses, each accessing circuit also being operatively coupled to the memory array of its respective integrated memory circuit for accessing a primary memory cell selected in accordance with a received address to communicate with external circuitry, each accessing circuit being modifiable by the enabling signal in accordance with a received address corresponding to an inoperable primary memory cell in the accessing circuit's respective memory array to access a redundant memory cell in the memory array instead of the inoperable primary memory cell for communication with external circuitry.

6. The memory device module of claim 1 wherein each enabling circuit receives a plurality of the input signals, wherein each enabling circuit comprises a plurality of fuse circuits each associated with a corresponding one of the enabling circuit's plurality of the input signals, each fuse circuit enabling its corresponding input signal to be one of the input signals in the set of the input signals to which the fuse circuit's respective enabling circuit is uniquely responsive.

7. The memory device module of claim 6 wherein each enabling circuit further comprises a plurality of pass gates each associated with a corresponding one of the enabling circuit's plurality of the input signals, each pass gate being operatively coupled to a corresponding fuse circuit for receiving an output signal, suppliable by each fuse circuit each pass gate enabling its corresponding input signal upon receiving its corresponding fuse circuit's output signal to be one of the input signals in the set of the input signals to which the pass gate's respective enabling circuit is uniquely responsive.

8. The memory device module of claim 7 wherein each fuse circuit includes an anti-fuse.

9. The memory device module of claim 1 wherein said enabling circuits are incorporated within said integrated memory circuits.

10. The memory device module of claim 1 wherein said function circuits are incorporated within said integrated memory circuits.

11. A memory device module comprising:

a plurality of integrated memory circuits each receiving a plurality of input signals including at least one address strobe signal, addresses and other input signals from external circuitry;

a plurality of enabling circuits each corresponding to one of the integrated memory circuits, each enabling circuit operatively coupled to its respective integrated memory circuit for receiving at least some of the input signals, each enabling circuit being uniquely responsive to a corresponding set of the input signals by outputting an enabling signal, each enabling circuit's corresponding set of the input signals including at least one of the other input signals;

a plurality of function circuits each operatively coupled to a corresponding one of the enabling circuits each function circuit being enabled by receiving the enabling signal from its respective enabling circuit, whereby the respective function circuit of one of the integrated memory circuits can be enabled without the respective function circuits of the other integrated memory circuits being enabled; and a plurality of contacts accessible through direct electrical contact by external circuitry wherein each of the input signals is coupled to at least one of said contacts.

12. The memory device module of claim 11 wherein each integrated memory circuit is provided on a die, each integrated memory circuit's die being separate from the other integrated memory circuit's dies.

13. The memory device module of claim 11 wherein each enabling circuit comprises a NAND gate.

14. The memory device module of claim 11 wherein each enabling circuit's corresponding set of the input signals includes a row address strobe signal, a column address strobe signal, and a data signal.

15. The memory device module of claim 11 wherein each function circuit comprises a redundant memory cell.

16. The memory device module of claim 11 wherein the memory device module each integrated memory circuit includes a memory array having a plurality of primary memory cells and a plurality of redundant memory cells, wherein each function circuit comprises an accessing circuit operatively coupled to the function circuit's respective integrated memory circuit for receiving addresses, each accessing circuit also being operatively coupled to the memory array of its respective integrated memory circuit for accessing a primary memory cell selected in accordance with a received address to communicate with external circuitry, each accessing circuit being modifiable by the enabling signal in accordance with a received address corresponding to an inoperable primary memory cell in the accessing circuit's respective memory array to access a redundant memory cell in the memory array instead of the inoperable primary memory cell for communication with external circuitry.

17. The memory device module of claim 11 wherein each enabling circuit receives a plurality of the input signals, wherein each enabling circuit comprises a plurality of fuse circuits each associated with a corresponding one of the enabling circuit's plurality of the input signals, each fuse circuit enabling its corresponding input signal to be one of the input signals in the set of the input signals to which the fuse circuit's respective enabling circuit is uniquely responsive.

18. The memory device module of claim 17 wherein each enabling circuit further comprises a plurality of pass gates each associated with a corresponding one of the enabling circuit's plurality of the input signals, each pass gate being operatively coupled to a corresponding fuse circuit for receiving an output signal suppliable by each fuse circuit, each pass gate being adapted to enable its corresponding input signal upon receiving its corresponding fuse circuit's output signal to be one of the input signals in the set of the input signals to which the pass gate's respective enabling circuit is uniquely responsive.

19. The memory device module of claim 18 wherein each fuse circuit includes an anti-fuse.

20. The memory device module of claim 11 wherein said enabling circuits are incorporated within said integrated memory circuits.

21. The memory device module of claim 11 wherein said function circuits are incorporated within said integrated memory circuits.

22. A computer system comprising:
   an input device;
   an output device;
   a processor operatively coupled to the input and output devices; and
   a memory device module housed in a package and communicating through circuitry external to the package with the processor, the memory device module comprising:
      a plurality of integrated memory circuits fabricated on respective semiconductor dies that are separate from each other, each of the integrated memory circuits receiving a plurality of input signals including at least one address strobe signal, addresses, and other input signals;
      a plurality of enabling circuits each corresponding to one of the integrated memory circuits, each enabling circuit operatively coupled to its respective integrated memory circuit for receiving at least some of the input signals, each enabling circuit being uniquely responsive to a corresponding set of the input signals by outputting an enabling signal, each enabling circuit's corresponding set of the input signals including at least one of the other input signals; and
      a plurality of function circuits each operatively coupled to a corresponding one of the enabling circuits, each function circuit being enabled by receiving the enabling signal from its respective enabling circuit, whereby the respective function circuit of one of the integrated memory circuits can be enabled without the respective function circuits of the other integrated memory circuits being enabled.

23. The computer system of claim 22 wherein each enabling circuit comprises a NAND gate.

24. The computer system of claim 22 wherein each enabling circuit's corresponding set of the input signals includes a row address strobe signal, a column address strobe signal, and a data signal.

25. The computer system of claim 22 wherein each function circuit comprises a redundant memory cell.

26. The computer system of claim 22 wherein each integrated memory circuit includes a memory array having a plurality of primary memory cells and a plurality of redundant memory cells, wherein each function circuit comprises an accessing circuit operatively coupled to the function circuit's respective integrated memory circuit for receiving addresses, each accessing circuit also being operatively coupled to the memory array of its respective integrated memory circuit for accessing a primary memory cell selected in accordance with a received address to communicate with the processor, each accessing circuit being modifiable by the enabling signal in accordance with a received address corresponding to an inoperable primary memory cell in the accessing circuit's respective memory array to access a redundant memory cell in the memory array instead of the inoperable primary memory cell for communication with the processor.

27. The computer system of claim 22 wherein each enabling circuit receives a plurality of the input signals, wherein each enabling circuit comprises a plurality of fuse circuits each associated with a corresponding one of the enabling circuit's plurality of the input signals, each fuse circuit enabling its corresponding input signal to be one of the input signals in the set of the input signals to which the fuse circuit's respective enabling circuit is uniquely responsive.

28. The computer system of claim 27 wherein each enabling circuit further comprises a plurality of pass gates each associated with a corresponding one of the enabling circuit's plurality of the input signals, each pass gate being operatively coupled to a corresponding fuse circuit for receiving an output signal suppliable by each fuse circuit, each pass gate being adapted to enable its corresponding input signal upon receiving its corresponding fuse circuit's output signal to be one of the input signals in the set of the input signals to which the pass gate's respective enabling circuit is uniquely responsive.

29. The computer system of claim 28 wherein each fuse circuit includes an anti-fuse.

30. The computer system of claim 22 wherein said enabling circuits are incorporated within said integrated memory circuits.

31. The computer system of claim 22 wherein said function circuits are incorporated within said integrated memory circuits.

32. A computer system comprising:
   an input device;
   an output device;
   a processor operatively coupled to the input and output devices: and
   a memory device module housed in a package and communicating through circuitry external to the package with the processor, the memory device module comprising:
      a plurality of integrated memory circuits each receiving a plurality of input signals including at least one address strobe signal, addresses, and other input signals;
      a plurality of enabling circuits each corresponding to one of the integrated memory circuits, each enabling circuit operatively coupled to its respective integrated memory circuit for receiving at least some of the input signals, each enabling circuit being uniquely responsive to a corresponding set of the input signals by outputting an enabling signal, each enabling circuit's corresponding set of the input signals including at least one of the other input signals;
      a plurality of function circuits each operatively coupled to a corresponding one of the enabling circuits, each function circuit being enabled by receiving the enabling signal from its respective enabling circuit, whereby the respective function circuit of one of the integrated memory circuits can be enabled without the respective function circuits of the other integrated memory circuits being enabled; and
      a plurality of contacts accessible through direct electrical contact by external circuitry wherein each of the input signals is coupled to at least one of said contacts.

33. The computer system of claim 32 wherein each integrated memory circuit is provided on a die, each integrated memory circuit's die being separate from the other integrated memory circuit's dies.

34. The computer system of claim 32 wherein each enabling circuit comprises a NAND gate.

35. The computer system of claim 32 wherein each enabling circuit's corresponding set of the input signals includes a row address strobe signal, a column address strobe signal, and a data signal.

36. The computer system of claim 32 wherein each function circuit comprises a redundant memory cell.

37. The computer system of claim 32 wherein each integrated memory circuit includes a memory array having a plurality of primary memory cells and a plurality of redundant memory cells, wherein each function circuit comprises an accessing circuit operatively coupled to the function circuit's respective integrated memory circuit for receiving addresses, each accessing circuit also being operatively coupled to the memory array of its respective integrated memory circuit for accessing a primary memory cell selected in accordance with a received address to communicate with the processor, each accessing circuit modifiable by the enabling signal in accordance with a received address corresponding to an inoperable primary memory cell in the accessing circuit's respective memory array to access a redundant memory cell in the memory array instead of the inoperable primary memory cell for communication with the processor.

38. The computer system of claim 32 wherein each enabling circuit receives a plurality of the input signals, wherein each enabling circuit comprises a plurality of fuse circuits each associated with a corresponding one of the enabling circuit's plurality of the input signals, each fuse circuit enabling its corresponding input signal to be one of the input signals in the set of the input signals to which the fuse circuit's respective enabling circuit is uniquely responsive.

39. The computer system of claim 38 wherein each enabling circuit further comprises a plurality of pass gates each associated with a corresponding one of the enabling circuit's plurality of the input signals, each pass gate being operatively coupled to a corresponding fuse circuit for receiving an output signal suppliable by each fuse circuit, each pass gate being adapted to enable its corresponding input signal upon receiving its corresponding fuse circuit's output signal to be one of the input signals in the set of the input signals to which the pass gate's respective enabling circuit is uniquely responsive.

40. The computer system of claim 39 wherein each fuse circuit includes an anti-fuse.

41. The computer system of claim 32 wherein said enabling circuits are incorporated within said integrated memory circuits.

42. The computer system of claim 32 wherein said function circuits are incorporated within said integrated memory circuits.

43. A memory module comprising a plurality of integrated memory circuits fabricated on respective semiconductor dies that are separate from each other, each of the integrated memory circuits receiving a plurality of input signals, including at least one address strobe signal, addresses, and other input signals from external circuitry, each of said integrated memory circuits including an enabling circuit receiving at least one of said input signals and being uniquely responsive to said at least one input signal by outputting an enabling signal, each of said integrated memory circuits further including a function circuit coupled to said enabling circuit, said function circuit altering or augmenting the operation of said integrated memory circuit responsive to said enabling signal.

44. The memory module of claim 43 wherein each integrated memory circuit includes a memory array having a plurality of primary memory cells and a plurality of redundant memory cells, wherein each function circuit comprises an accessing circuit operatively coupled to the function circuit's respective integrated memory circuit for receiving addresses, each accessing circuit also being operatively coupled to the memory array of its respective integrated memory circuit for accessing a primary memory cell selected in accordance with a received address to communicate with external circuitry, each accessing circuit being modifiable by the enabling signal in accordance with a received address corresponding to an inoperable primary memory cell in the accessing circuit's respective memory array to access a redundant memory cell in the memory array instead of the inoperable primary memory cell for communication with external circuitry.

45. The memory module of claim 43 wherein said enabling circuit receives a plurality of said input signals, wherein each enabling circuit comprises a plurality of fuse circuits each associated with a corresponding one of the enabling circuit's plurality of the input signals, each fuse circuit enabling its corresponding input signal to be one of the input signals in the set of the input signals to which the fuse circuit's respective enabling circuit is uniquely responsive.

46. A memory module comprising a plurality of integrated memory circuits each receiving a plurality of input signals, including at least one address strobe signal, addresses and other input signals from external circuitry, each of said integrated memory circuits including an enabling circuit receiving at least one of said input signals and being uniquely responsive to said at least one input signal by outputting an enabling signal, each of said integrated memory circuits further including a function circuit coupled to said enabling circuit, said function circuit altering or augmenting the operation of said integrated memory circuit responsive to said enabling signal the memory module further comprising a plurality of contacts accessible through direct electrical contact by external circuitry wherein each of said input signals is coupled to at least one of said contacts.

47. The memory module of claim 46 wherein each of said integrated memory circuits is fabricated on a semiconductor die each of which is physically separate from the dies of other integrated memory circuits.

48. The memory module of claim 46 wherein each integrated memory circuit includes a memory array having a plurality of primary memory cells and a plurality of redundant memory cells, wherein each function circuit comprises an accessing circuit operatively coupled to the function circuit's respective integrated memory circuit for receiving addresses, each accessing circuit also being operatively coupled to the memory array of its respective integrated memory circuit for accessing a primary memory cell selected in accordance with a received address to communicate with external circuitry, each accessing circuit being modifiable by the enabling signal in accordance with a received address corresponding to an inoperable primary memory cell in the accessing circuit's respective memory array to access a redundant memory cell in the memory array instead of the inoperable primary memory cell for communication with external circuitry.

49. The memory module of claim 46 wherein said enabling circuit receives a plurality of said input signals, wherein each enabling circuit comprises a plurality of fuse circuits each associated with a corresponding one of the enabling circuit's plurality of the input signals, each fuse circuit enabling its corresponding input signal to be one of the input signals in the set of the input signals to which the fuse circuit's respective enabling circuit is uniquely responsive.

50. An integrated memory circuit, comprising:

an array of memory cells;

an accessing circuit allowing external communication of address, data and other signals with said array;

an enabling circuit receiving as input signals at least some of said address, data and other signals, said enabling circuit being uniquely responsive to said input signals by outputting an enabling signal;

a function circuit coupled to said enabling circuit, said function circuit altering or augmenting the operation of said array responsive to said enabling signal; and a plurality of contacts accessible through direct electrical contact by external circuit wherein each of said input signals is coupled to at least one of said contacts.

51. The integrated memory circuit of claim 50 wherein said memory array has a plurality of primary memory cells and a plurality of redundant memory cells, wherein said accessing circuit is operatively coupled to said function circuit for receiving addresses, said accessing circuit also being operatively coupled to said memory array for accessing a primary memory cell selected in accordance with a received address to communicate with external circuitry, said accessing circuit being modifiable by the enabling signal in accordance with a received address corresponding to an inoperable primary memory cell in said memory array to access a redundant memory cell in the memory array instead of the inoperable primary memory cell for communication with external circuitry.

52. The integrated memory circuit of claim 50 wherein said enabling circuit receives a plurality of said input signals, wherein each enabling circuit comprises a plurality of fuse circuits each associated with a corresponding one of the enabling circuit's plurality of the input signals, each fuse circuit enabling its corresponding input signal to be one of the input signals in the set of the input signals to which the fuse circuit's respective enabling circuit is uniquely responsive.

53. The integrated memory circuit of claim 50, further including a programming circuit for selecting a combination of said address, data and other signals to which said enabling circuit is to be uniquely responsive.

54. The integrated memory circuit of claim 50 wherein said programming circuit may be programmed to select said combination of said address, data and other signals after a plurality of said integrated memory circuits have been combined and packaged in a memory module.

55. In a memory device module housed in a package, the memory device module having a plurality of integrated memory circuits therein fabricated on respective semiconductor dies that are separate from each other, each of the integrated memory circuits receiving a plurality of input signals including at least one address strobe signal, addresses, and other input signals from external circuitry, each integrated memory circuit having a plurality of primary memory cells and a plurality of redundant memory cells, each integrated memory circuit being modifiable in accordance with a received address upon receiving an enabling signal to access one of its redundant memory cells instead of a primary memory cell associated with the received address, a method for programming one of the integrated memory circuits to access one of its redundant memory cells instead of a primary memory cell for communication with external circuitry, the method comprising:

determining an address corresponding to an inoperable primary memory cell in one of the integrated memory circuits;

providing the determined address to the integrated memory circuit;

selecting a unique set of the input signals to which the memory device module responds by providing an enabling signal to the integrated memory circuit, the set including at least one of the other input signals;

providing each of the input signals in the set to the integrated memory circuit so that it receives the enabling signal, whereby the integrated memory circuit is modified in accordance with the determined address to access a redundant memory cell instead of the inoperable primary memory cell for communication with external circuitry.

56. The method of claim 55 wherein the step of selecting the unique set of the input signals comprises, for each of the input signals which is to be in the set, enabling the input signal to be in the set with a fuse.

57. The method of claim 55 wherein the step of selecting the unique set of the input signals comprises, for each of the input signals which is to be in the set, enabling the input signal to be in the set with an anti-fuse.

* * * * *

UNITED STATES PATENT AND TRADEMARK OFFICE
CERTIFICATE OF CORRECTION

PATENT NO.   : 5,825,697
DATED        : October 20, 1998
INVENTOR(S)  : Gary R. Gilliam, Kevin G. Duesman and Leland R. Nevill It is certified that error appears in the above-identified patent and that said Letters Patent is hereby corrected as shown below:

Column 4,
Line 21, "such as (A8.)" should read -- such as A8. --

Column 5,
Lines 63-64, "the fuses F1, F2" should read -- the fuses or antifuses F1, F2 --
Line 66, "the fuses F1, F2" should read -- the fuses or antifuses F1, F2 --

Column 6,
Line 48, "preferred embodiment" should read -- preferred embodiment, --
Line 58, "each other each of" should read -- each other, each of --

Column 7,
Line 51, "each fuse circuit" should read -- each fuse circuit, --

Column 8,
Lines 35-36, "claim 11 wherein the memory device module each" should read -- claim 11 wherein each --

Column 12,
Line 41, "enabling signal the memory" should read -- enabling signal, the memory --

Column 13,
Line 21, "external circuit wherein" should read -- external circuitry wherein --

Signed and Sealed this

Fifth Day of March, 2002

*Attest:*

*Attesting Officer*

JAMES E. ROGAN
*Director of the United States Patent and Trademark Office*